United States Patent
Kistner

(10) Patent No.: US 6,828,513 B2
(45) Date of Patent: Dec. 7, 2004

(54) ELECTRICAL CONNECTOR PAD ASSEMBLY FOR PRINTED CIRCUIT BOARD

(75) Inventor: Kris Kistner, Colleyville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/135,132

(22) Filed: Apr. 30, 2002

(65) Prior Publication Data

US 2003/0201123 A1 Oct. 30, 2003

(51) Int. Cl.[7] .......................... H05K 1/11; H01R 12/04
(52) U.S. Cl. .................. 174/261; 174/262; 174/266; 361/795
(58) Field of Search ............................. 174/261, 262, 174/266, 263, 264, 265; 361/792, 793, 794, 795, 808; 257/698, 774, 775

(56) References Cited

U.S. PATENT DOCUMENTS

| | | | |
|---|---|---|---|
| 4,383,363 A | 5/1983 | Hayakawa et al. | |
| 4,451,103 A | 5/1984 | Buresh et al. | |
| 4,871,317 A | 10/1989 | Jones | |
| 5,120,258 A | 6/1992 | Carlton | |
| 5,325,455 A | 6/1994 | Henson et al. | |
| 5,411,409 A | 5/1995 | Gray et al. | |
| 5,466,166 A | 11/1995 | Law et al. | |
| 5,498,174 A | 3/1996 | Speer et al. | |
| 5,525,075 A | 6/1996 | Michisita et al. | |
| 5,823,790 A | 10/1998 | Magnuson | |
| 5,842,873 A | 12/1998 | Gonzales | |
| 5,856,636 A * | 1/1999 | Sanso | 174/255 |
| 5,860,812 A | 1/1999 | Gugliotti | |
| 5,944,548 A | 8/1999 | Saito | |
| 6,054,653 A * | 4/2000 | Hansen et al. | 174/261 |
| 6,081,996 A | 7/2000 | Kruppa et al. | |
| 6,164,977 A | 12/2000 | Lester | |
| 6,200,144 B1 | 3/2001 | Wark | |
| 6,201,305 B1 * | 3/2001 | Darveaux et al. | 257/779 |
| 6,224,421 B1 | 5/2001 | Maturo, Jr. | |
| 6,247,228 B1 * | 6/2001 | Distefano et al. | 29/830 |
| 6,265,952 B1 | 7/2001 | Kan | |
| 6,302,732 B1 | 10/2001 | Budman et al. | |
| 6,366,466 B1 * | 4/2002 | Leddige et al. | 361/760 |
| 6,383,603 B1 * | 5/2002 | Nojioka | 428/132 |
| 6,388,206 B2 * | 5/2002 | Dove et al. | 174/262 |
| 6,395,378 B2 * | 5/2002 | Bergstedt et al. | 428/209 |
| 6,405,920 B1 * | 6/2002 | Brunner et al. | 228/248.1 |

FOREIGN PATENT DOCUMENTS

JP   402094693 A  *  4/1990

* cited by examiner

Primary Examiner—David Zarneke
Assistant Examiner—J B Pate
(74) Attorney, Agent, or Firm—W. Daniel Swayze, Jr.; W. James Brady; Frederick J. Telecky, Jr.

(57) ABSTRACT

A connector pad includes projections extending radially outwardly from an inner portion of the pad to help stabilize and reinforce the pad. The added stability allows the radial thickness of an inner portion of the pad to be reduced. This decreases the surface area of the pad and reduces the opportunity for capacitive build up to occur relative to an associated conductive plane in a circuit board.

10 Claims, 9 Drawing Sheets

US 6,828,513 B2

ELECTRICAL CONNECTOR PAD ASSEMBLY FOR PRINTED CIRCUIT BOARD

TECHNICAL FIELD

The present invention relates generally to electrical connections, and more particularly to an electrical connector assembly for a printed circuit board.

BACKGROUND OF THE INVENTION

Numerous connectors exist to facilitate mounting components to circuit boards and to establish electrical interconnections therebetween. One such type of connector is a subminiature connector assembly. Subminiature connector assemblies are integrated atop circuit boards and are generally utilized to connect a cable, such as a coaxial cable, to circuit boards. Such connectors are commonly referred to as SMA, SMB or SMC connectors to designate operation of the subminiature connectors in different frequencies (e.g., of about 18,4 and 10 GHz, respectively).

FIG. 1 illustrates a top view or footprint of a conventional subminiature connector assembly 100 (e.g., SMA, SMB, SMC) that may be integrated onto a circuit board. The connector assembly 100 includes a central through-hole or via 104, which is surrounded by an arrangement of associated vias 108. The vias provide passages that allow corresponding leads (or pins) to pass therethrough to facilitate electrical connections and component mounting to the circuit board. In the example of FIG. 1, the four perimeter vias 108 of the connector 100 typically facilitate a connection to ground, whereas the central hole 104 provides for connecting a central conductor to a power source or other associated circuitry. Respective connector pads 114, 118 surround each of the through-holes. The connector pads are conductive material disposed usually on top and/or on bottom of the circuit board.

A circuit board generally comprises several layers that lie below the connector assembly 100 illustrated in FIG. 1. Such layers include conductive elements, such as conductive traces (e.g., associated with power and/or ground planes), as well as non-conductive material (e.g., dielectric material). Dielectric layers are typically situated between conductive layers to electrically separate the layers. With reference back to FIG. 1, for example, a dielectric layer typically is positioned between the central connector pad 114 and an associated power or ground layer. Such an arrangement, however, often leads to capacitive charging, which can significantly degrade the intended operation and performance of the circuitry associated with the circuit board.

By way of example, it is known that a capacitor consists of two opposed conducting plates separated by an insulating material or dielectric. The resulting capacitance is directly proportional to the surface areas of the opposed plates, and is inversely proportional to the distance between the plates. As such, where a connector pad overlaps or is in close proximity to a conductive layer, and a dielectric layer is interposed therebetween, capacitive build up can result. This effect tends to occur more readily at high frequencies, such as those frequencies within which subminiature connectors usually operate.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention relates generally to a connector pad includes projections extending outwardly from an inner portion of the pad to help stabilize and reinforce the pad and an associated through-hole. The added stability allows the radial thickness of an inner portion of the pad to be reduced relative to other connection pads that may be part of the board. This decreases the surface area of the pad and reduces the opportunity for capacitive build up to occur relative to an associated conductive plane in a circuit board.

According to another aspect of the present invention, the circuit board can include an anti-pad layer in substantially the same plane as the conductive plane, which anti-pad provides a clearance area around the through-hole that can be increased to further separate the pad from the underlying conductive layer. The increase in separation between the pad and the conductive layer further mitigates the opportunity for capacitive build up to occur.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

DETAILED DESCRIPTION OF THE INVENTION

According to one or more aspects of the present invention, a connector pad includes projections extending radially outwardly from an inner portion of the pad to help stabilize and reinforce the pad. The added stability allows the radial thickness of an inner portion of the pad to be reduced. This helps mitigate capacitive build up that tends to occur between the connector pad and an associated conductive plane in a circuit board. According to another aspect of the present invention, the circuit board can include an anti-pad layer in substantially the same plane as the conductive plane, which anti-pad provides a clearance area around the through-hole that can be increased to further separate the pad from the underlying conductive layer. The increase in separation between the pad and the conductive layer further mitigates the opportunity for capacitive build up to occur.

Figure 2:
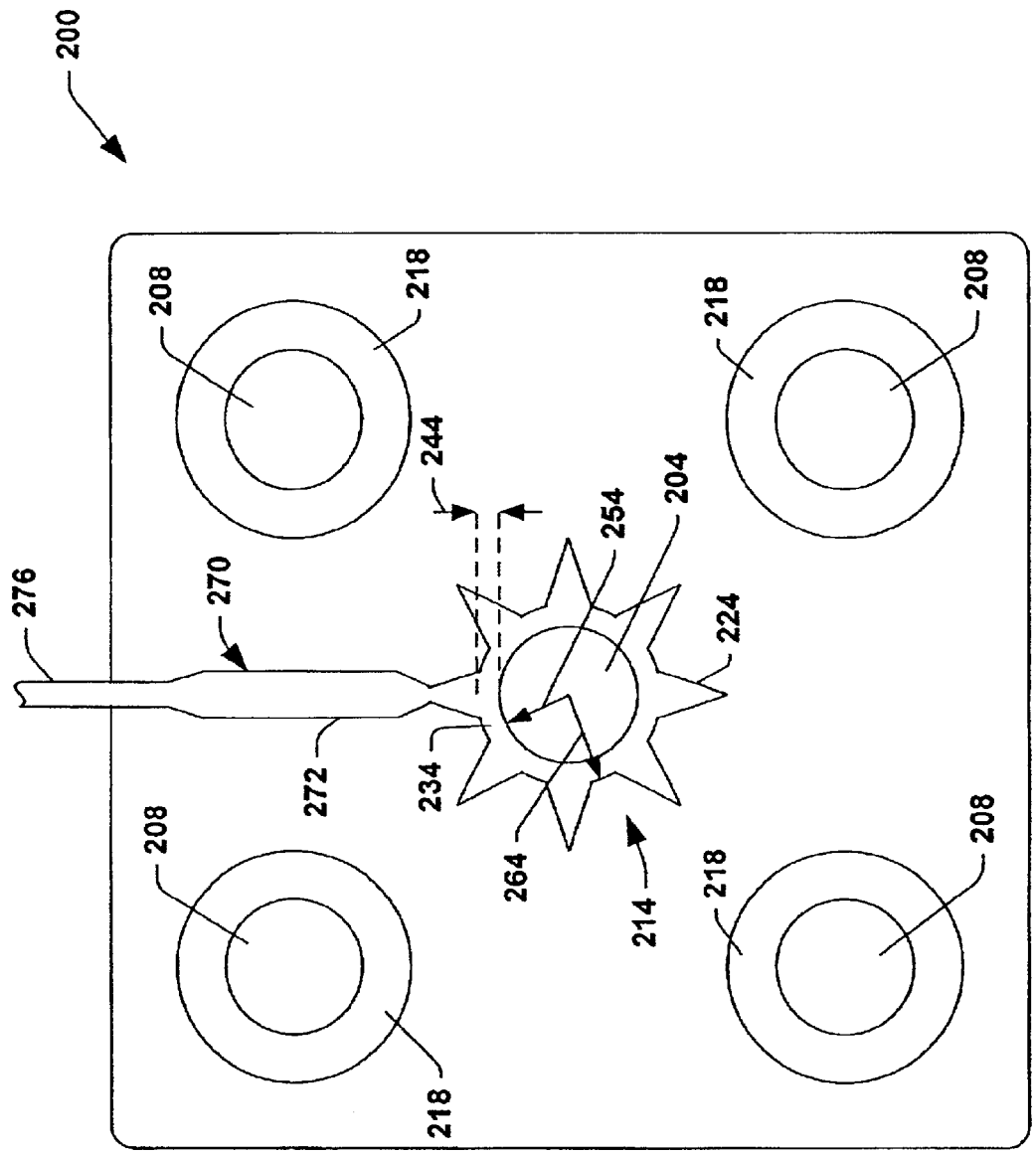
FIG. 2 illustrates a top view of a connector pad assembly according to an aspect of the present invention.

FIG. 2 illustrates a top view of a subminiature connector pad assembly 200 according to one or more aspects of the present invention. The assembly 200 includes a central through-hole or via 204 surrounded by a plurality of through-holes or vias 208. The through-holes 204, 208 are dimensioned and configured to receive respective male leads (or pins) to facilitate electrical connections and component mounting relative to a circuit board upon which the assembly 200 is integrated. The through-holes define passages, which may be lined with a conductive material (not shown) to promote desired electrical connections. The holes 208 near the perimeter of the assembly 200 usually facilitate a connection to ground. The central hole 204 provides an active connection for a central male conductor lead to associated circuitry.

The assembly 200 also includes connector pads 214, 218 associated around respective through-holes 204, 208. The pads 214, 218 are generally coplanar, such as situated on a top and/or bottom surface of the circuit board, although the pads could be located at different layers of the board. The pads 214, 218 are made of an electrically conductive material, such as aluminum, copper, an alloy, or the like. The pads 214, 218 facilitate electrical connections to circuit components as well as with other layers in the circuit board. The conductive lining along cylindrical sidewalls of the through-holes 204, 208 usually are formed of the same material as the connector pads 214, 218, and can be integrally formed with the connector pads.

Figure 1:
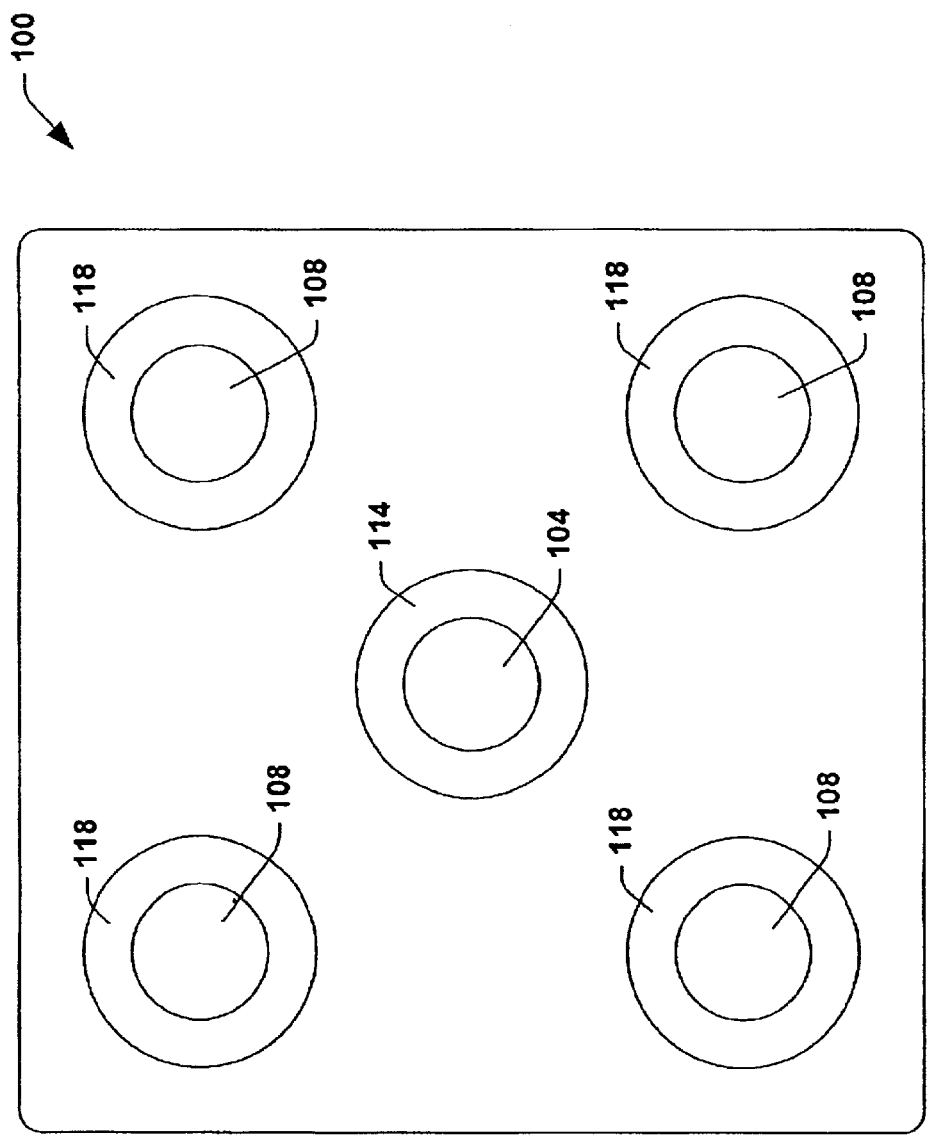
FIG. 1 illustrates a top view of a footprint of a prior art subminiature connector pad assembly.

In accordance with an aspect of the present invention, the connector pad 214 associated with the central through-hole 204 includes a plurality of projections 224 extending radially outwardly from an annular inner disc portion 234 of the pad. For example, the projections 224 are arranged in a generally circular array about the through-hole 204. The inner disc portion 234 of the central connector pad 214 has a radial thickness, indicated at 244, which is defined by the difference between an inner radius 254 and an outer radius 264 of the inner disc portion 234. The inner edge of the disc portion 234 is arranged substantially coaxially relative to the through-hole 204. The projections 224 reinforce and provide stability to the through-hole and pad relative to the circuit board. Additionally, this arrangement enables the radial thickness of the pad 214 at its inner disc portion 234 to be reduced when compared relative to conventional pads. For example, its radial thickness 244 is depicted as being less than that of the other pads 218 of the assembly 200 and less than conventional central connector pads surrounding central through-holes (e.g., as shown in FIG. 1).

In the example illustrated in FIG. 2, the projections 224 are depicted as generally triangularly shaped members spaced circumferentially about the inner disc portion 234. As such, the pad 214 has a generally star-shaped configuration and thus may be referred to herein as a star-pad configuration. It is to be understood and appreciated, however, that there can be any number of projections and that the projections can have any shape. Examples of some alternative arrangements for pad projections, in accordance with one or more aspects of the present invention, are shown and described herein with respect to FIGS. 6–8. Additionally, those skilled in the art will understand and appreciate that while the inner and outer edges of the inner disc portion 234 are shown as being substantially circular, other shapes (e.g., elliptical, polygonal, etc.) also could be employed to provide a connector pad in accordance with one or more aspects of the present invention.

In the example of FIG. 2, a conductive trace 270 is connected to the central connector pad 214. The conductive trace 270 is connected to an end of one of the projections 224 of the pad 214. The trace 270 can be formed the same (or different) electrically conductive material as the central connector pad 214. A length 272 of the trace 270 near the connection to the pad 214 has an increased width relative to a portion 276 of the trace 270 distal the connector pad 214. The increased width at 276 of the trace 270 provides increased line impedance in the wider portion to compensate for the effects of an enlarged non-conductive underlying anti-pad (not shown) located on a different planar layer of the circuit board. As described herein, the anti-pad provides a nonconductive clearance area between a conductive layer and the central through-hole according to one or more aspects of the present invention.

By way of example, the line impedance of the trace 270 is measured relative to a conductive plane (e.g. a ground or power plane). Since, as will be discussed in greater detail below, the conductive plane can be positioned away from the central through-hole 204 by increasing a clearance area, known as the anti-pad, around the through-hole 214, the width of the line is thus increased to compensate for absence of the ground (or power plane) beneath the trace 270. For example, to maintain a desired substantially constant line impedance of about a 50 O, the width of the trace 270 may be increased by a factor of about two (e.g., about two-times as wide) near the connection to the pad 214.

It is to be appreciated that the reduced radial thickness 244 of the inner disc portion 234 reduces the surface area of the central connector pad 214, thus decreasing the capacitance that can develop between the pad 214 and underlying conductive layers (e.g., ground and/or power layers). The added stability provided by the projections also allows the radial thickness of the associated non-conductive anti-pad (not shown), to be enlarged so as to position the conductive material away from the through-hole 204. Thus, at higher frequencies, such as greater than 1 GHz, the connector assembly enables improved electrical performance with desired structural integrity for component mounting.

Figure 3:
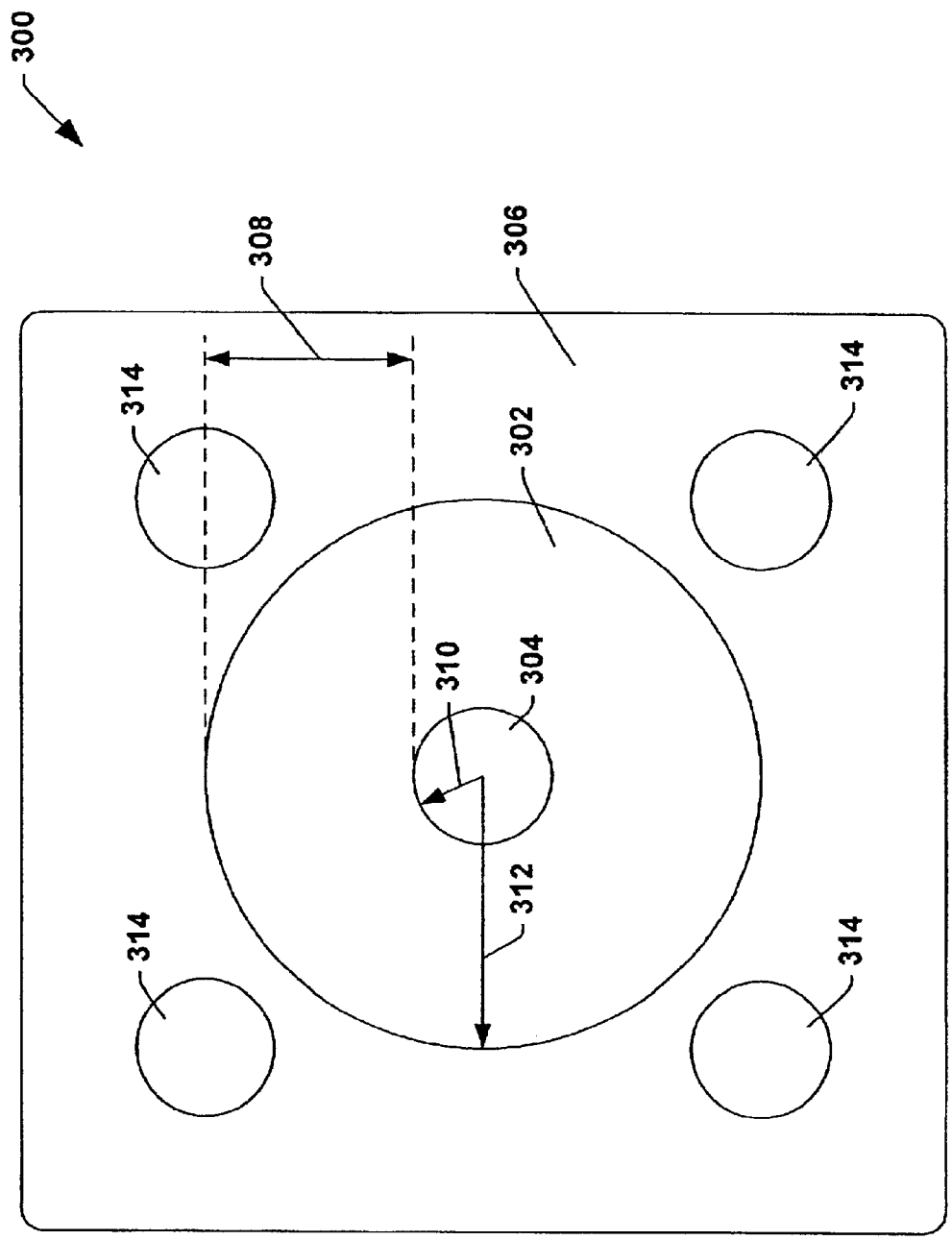
FIG. 3 illustrates a top view of an intermediate circuit board layer for use with a connector pad assembly according to an aspect of the present invention.

FIG. 3 illustrates an example of another layer 300 of a circuit board that includes an anti-pad 302 according to one or more aspects of the present invention. For example, the layer 300 includes the anti-pad 302 and a co-planar or adjacent layer of conductive material 306. The layer 300 may form an intermediate layer of a circuit board that lies one or more layers beneath the layer 200 illustrated in FIG. 2.

Similar to the central connector pad 214 depicted in FIG. 2, the anti-pad 302 circumscribes a central through-hole 304. The anti-pad 302 corresponds to an insulating layer (e.g., of a dielectric material) that separates the conductive material 306 (e.g., power or ground layer) from the central through-hole 304. The anti-pad 302 extends radially outwardly from a location at (or near) the through-hole 304 to an outer radial extent to provide a radial thickness 308. The radial thickness of the anti-pad 302 corresponds to the difference between an inner radius 310 and an outer radius 312 of the anti-pad 302. Those skilled in the art will understand and appreciate that while the inner and outer edges of the anti-pad are shown as being substantially circular, other shapes also could be employed to provide an anti-pad in accordance with an aspect of the present invention.

The radial thickness 308 of the anti-pad 302 is at least equal to the radial thickness of an overlying central connector pad, including its projections (e.g., the central pad 214 of FIG. 2). For example, the anti-pad 302 can have an outer radius 312 between that of the outer extent of projections of an overlying central connector pad up to a radius that intersects with peripheral through-holes 314, which are arranged about the central through-hole 304.

Since the anti-pad 302 surrounds the through-hole 304 at a conductive layer of the circuit board, the anti-pad 302 positions the co-planar conductive material away from an overlying central connector pad according to the radial thickness of the anti-pad. This relationship can be seen better with reference to FIG. 4. The anti-pad 302 is formed of a non-conductive material and, as such, acts as a shield electrically isolating the conductive layer 306 from an overlying central connector pad. In so doing, the anti-pad mitigates capacitive build up between these layers, and does so to a greater degree as its radial thickness 308 increases.

By way of illustration, in a circuit board, the through-holes 304, 314 are substantially coaxial with and define part of the same cylindrical passages through a circuit board as the respective through-holes 204, 208 shown and described with respect to FIG. 2. That is, the holes 304, 314 are dimensioned and configured to align with the holes in other layers of the board to facilitate insertion and/or removal of male leads or pins of circuit components, such as connectors. It is to be appreciated that the through-holes 304, 314 are also typically lined with a conductive material (not shown) to promote electrical connections.

Figure 4:
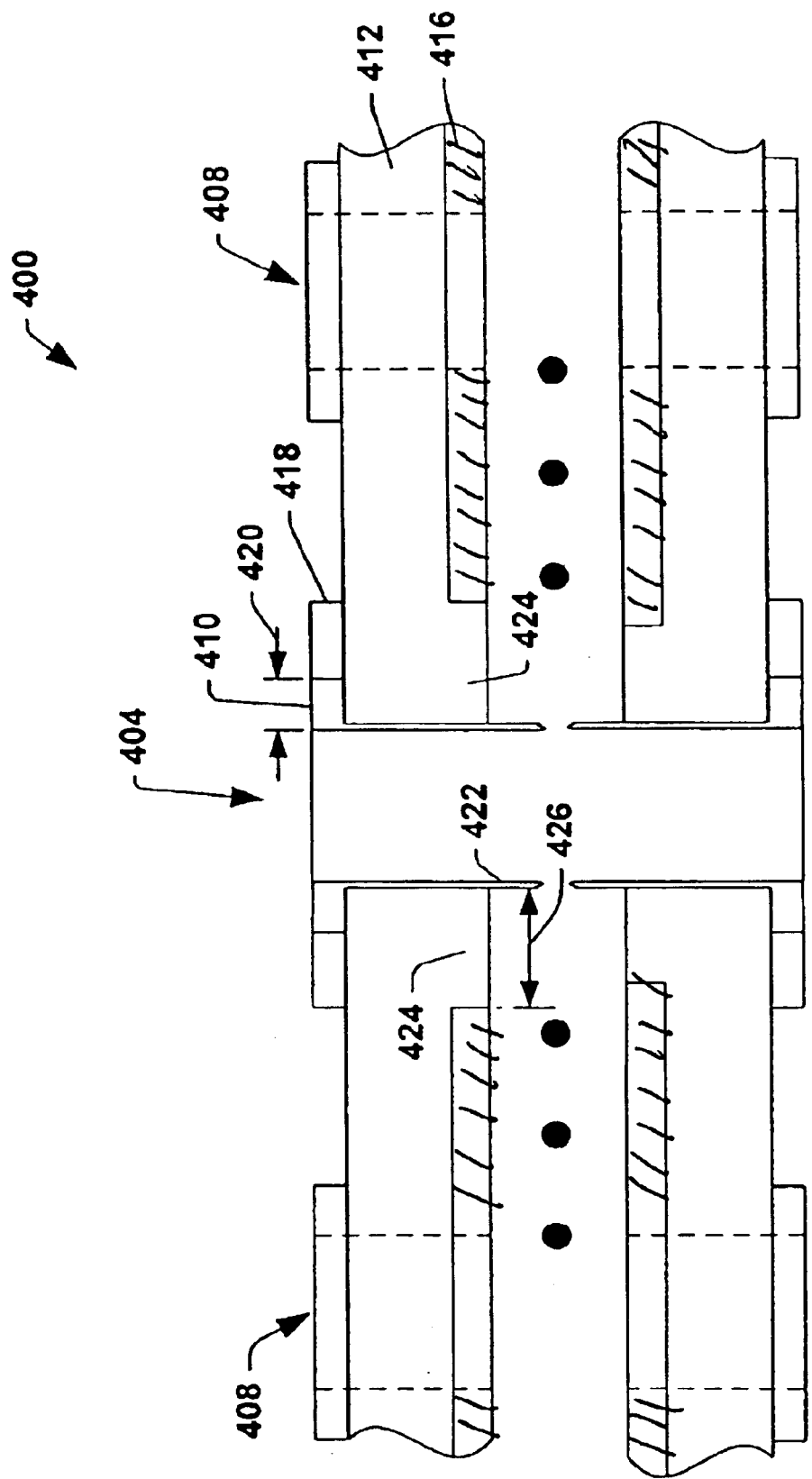
FIG. 4 illustrates a cross sectional side view of a circuit board that includes a connector pad according to an aspect of the present invention.

FIG. 4 illustrates a cross sectional side view of part of a circuit board 400 that includes layers subminiature connector pad assembly corresponding to those depicted in FIGS. 2 and 3 according to one or more aspects of the present invention. The circuit board 400 includes a central through-hole 404 and peripheral through-holes 408. A central connector pad 410 is disposed atop a dielectric layer 412, which itself rests on a conductive layer 416 (e.g., ground or power). Those skilled in the art will understand and appreciate other layers (indicated as an ellipsis) that can be utilized in a circuit board, such as may vary according to the particular application for which the board is to be used.

In accordance with an aspect of the present invention, the connector pad 410 includes projections 418 that extend outwardly from an inner disc portion of the pad 410. The inner portion of the central connector pad 410 has a radial thickness 420, which is less than the radial thickness of central connector pads of conventional subminiature connector assemblies (e.g., see FIG. 1).

In the example illustrated, the through-holes 404, 408 extend entirely through the board 400, buy may extend to any degree as is necessary to implement the desired functioning of the circuit board and components mounted thereon. A cylindrical body of electrically conductive material extends through the respective through-holes to define a sidewall of the respective holes. The electrically conductive material facilitates electrical connections relative to pins that are inserted into the through-holes. For example, a cylindrical sidewall 422 of the central through-hole is formed of an electrically conductive material that extends through the central through-hole 404. The cylindrical sidewall 422 interconnects the connector pads 410 at opposite surfaces of the board 400. The connector pads 410 and the sidewall 422 can be formed of an integral piece of the conductive material.

The board 400 also includes an anti-pad 424 associated with the electrically conductive layer 416 of the board. The anti-pad 424 electrically insulates the central through-hole 404 and its associated conductive sidewall 422 from the conductive layer 416. That is, the anti-pad 424 provides a clearance area between the through-hole and the conductive plane 416. In the example shown, the radial thickness 426 of the anti-pad 424 is about equal to or greater than the radial thickness 420 of the central connector pad 410. Accordingly, there is no overlap between the connector pad 410 and the conductive layer 416 axially relative to the board, which reduces the opportunity for capacitance to develop between the pad 410 and conductive layer 416.

Figure 5:
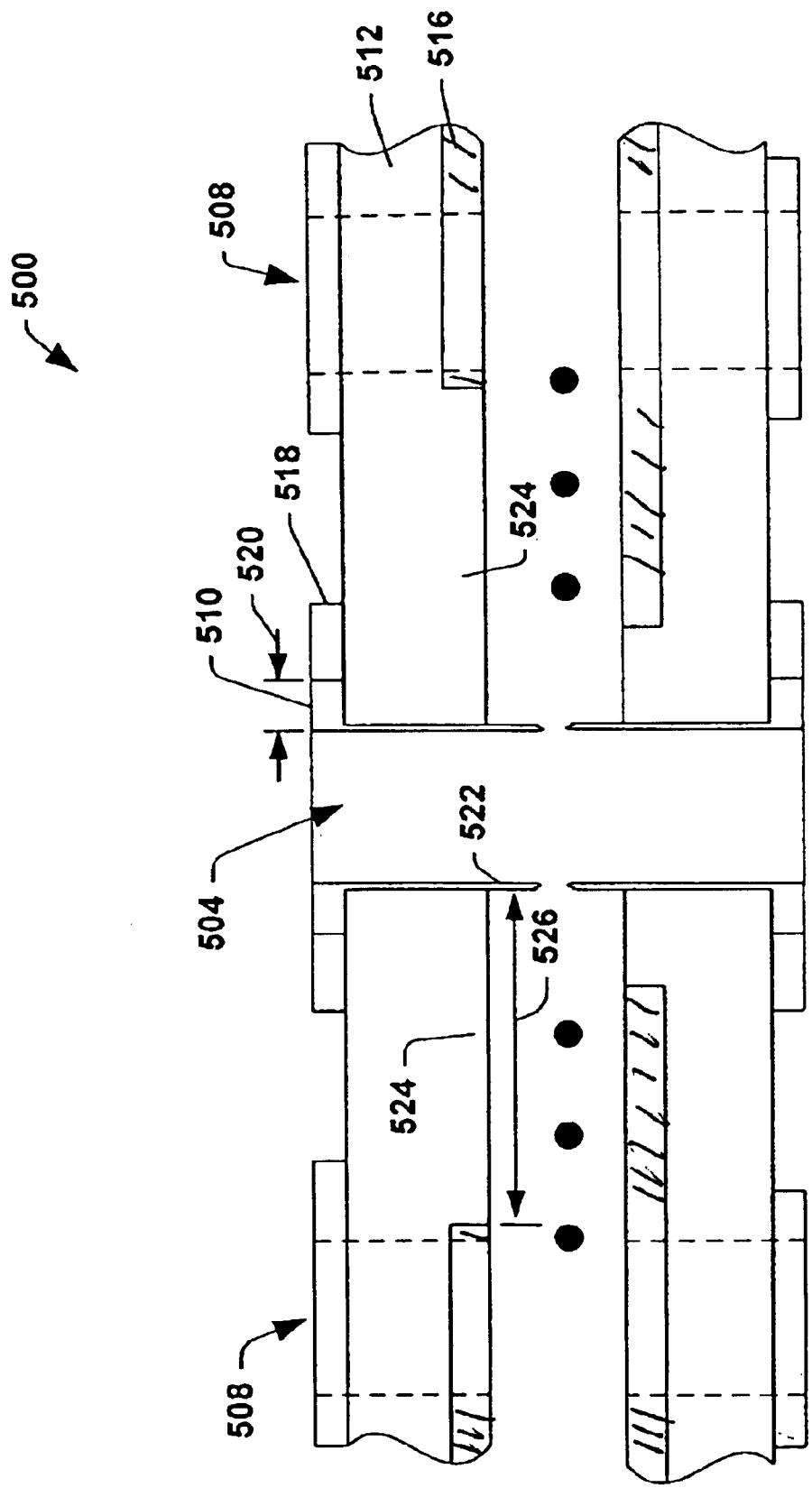
FIG. 5 illustrates a cross sectional side view of a circuit board that includes a connector pad according to another aspect of the present invention.

FIG. 5 illustrates another cross sectional side view of part of a circuit board 500 configured according to one or more aspects of the present invention. The illustrated portion of the connector pad assembly in FIG. 5 is substantially similar to that of FIG. 4, with identical reference numbers increased by adding 100 being used to refer to parts of the circuit board previously identified with respect to FIG. 4. In the example of FIG. 5, the radial thickness 526 of the anti-pad 524 is shown as being larger than the anti-pad 424 of FIG. 4. In particular, the anti-pad 524 extends generally from the central through-hole 504 radially to a location near a peripheral through-hole 508. The increased thickness provides increased electrical isolation between the associated ground or power plane 516 and the central connector pad 510, thereby further mitigating capacitance between the connector pad 510 and the conductive plane 516. This arrangement further separates the conductive plane 516 from the central through hole 504.

Figure 6:
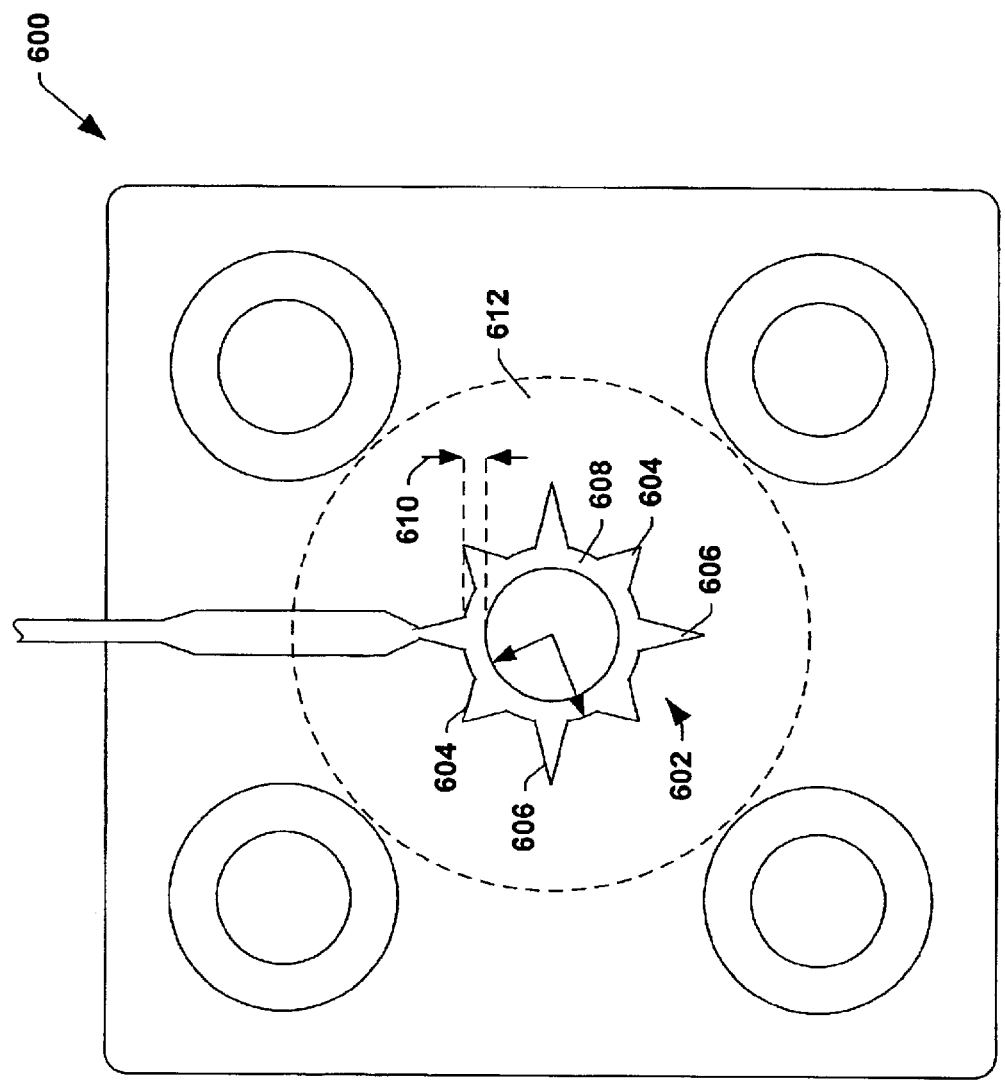
FIG. 6 illustrates a top view of a connector pad assembly according to an aspect of the present invention.

FIG. 6 illustrates an alternative example of a subminiature connector pad assembly 600 in accordance with an aspect of the present invention. In this example, a central connector pad 602 includes a plurality of generally triangular projections 604 and 606 extending radially from an inner disc portion 608 of the central connector pad. Some of the triangular projections 604 and 606 have different dimensions. For instance, some of the projections 604 are shorter, while other projections 606 are relatively thinner and longer (e.g., when compared relative to those illustrated in FIG. 2). Thus, it is to be appreciated that the projections of a connector pad 602 need not be of a constant length of width. Nevertheless, the projections 604, 606 stabilize the central connector pad 602 for component mounting and allow the inner disc portion 608 to have a smaller radial thickness, indicated at 610, than that of conventional central connector pads (e.g., see FIG. 1).

An underlying anti-pad 612 (shown in phantom) also has a radial thickness that is larger than that of anti-pads underlying conventional subminiature connector assemblies. In view of the foregoing, it will be appreciated that the connector pad assembly 600 can be integrated into a circuit board to establish electrical connections and component mountings thereto. The configuration of the connector pad 602 further provides a reduced surface area to facilitate separating associated conductive layers, thereby mitigating capacitive effects.

Figure 7:
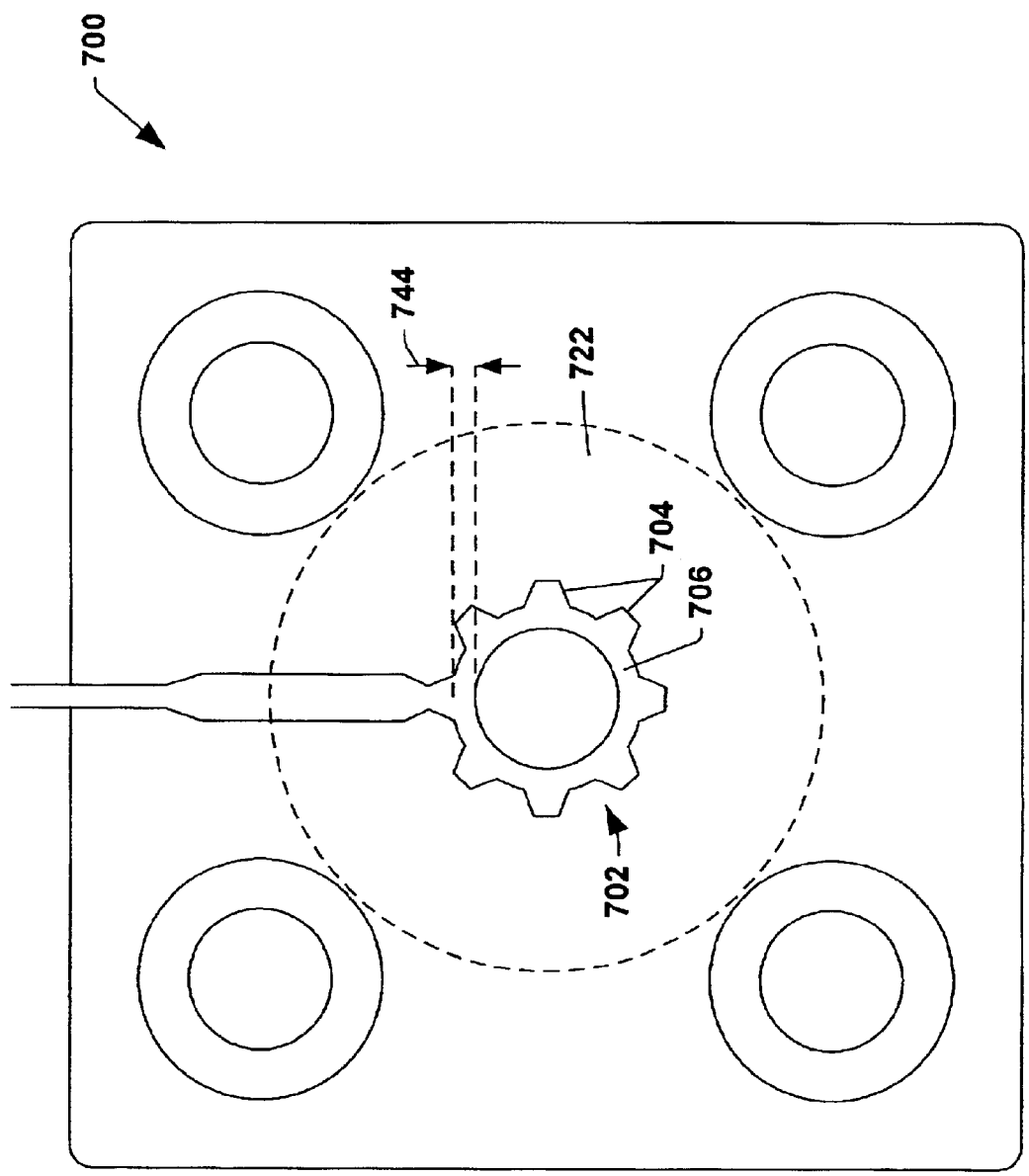
FIG. 7 illustrates a top view of a connector pad assembly according to an aspect of the present invention.

FIG. 7 illustrates another example of a subminiature connector pad assembly 700 that can be integrated into a circuit board to establish electrical connections and component mountings thereto in accordance with one or more aspects of the present invention. In this example, the assembly 700 includes a connector pad 702 having a plurality of projections 704 extending radially from an inner disc portion 706 of the central connector pad. The projections 704 are generally trapezoidal, having an increased width at the end connecting at the inner disc portion 706 and tapering to a reduced width at an end spaced radially from the inner disc portion. It is to be appreciated that the projections can have any configuration and could have rounded rather than pointed corners, for example. The projections 704 reinforce the central connector pad 702 allowing the inner disc portion 706 to have a smaller radial thickness 708 than that of conventional central connector pads (e.g., see FIG. 1). An underlying anti-pad 710 (shown in phantom) also has a radial thickness that is larger than that of anti-pads underlying conventional subminiature connector assemblies. These features reduce the surface area of and separate conductive layers and thereby mitigate capacitive effects, as described herein.

Figure 8:
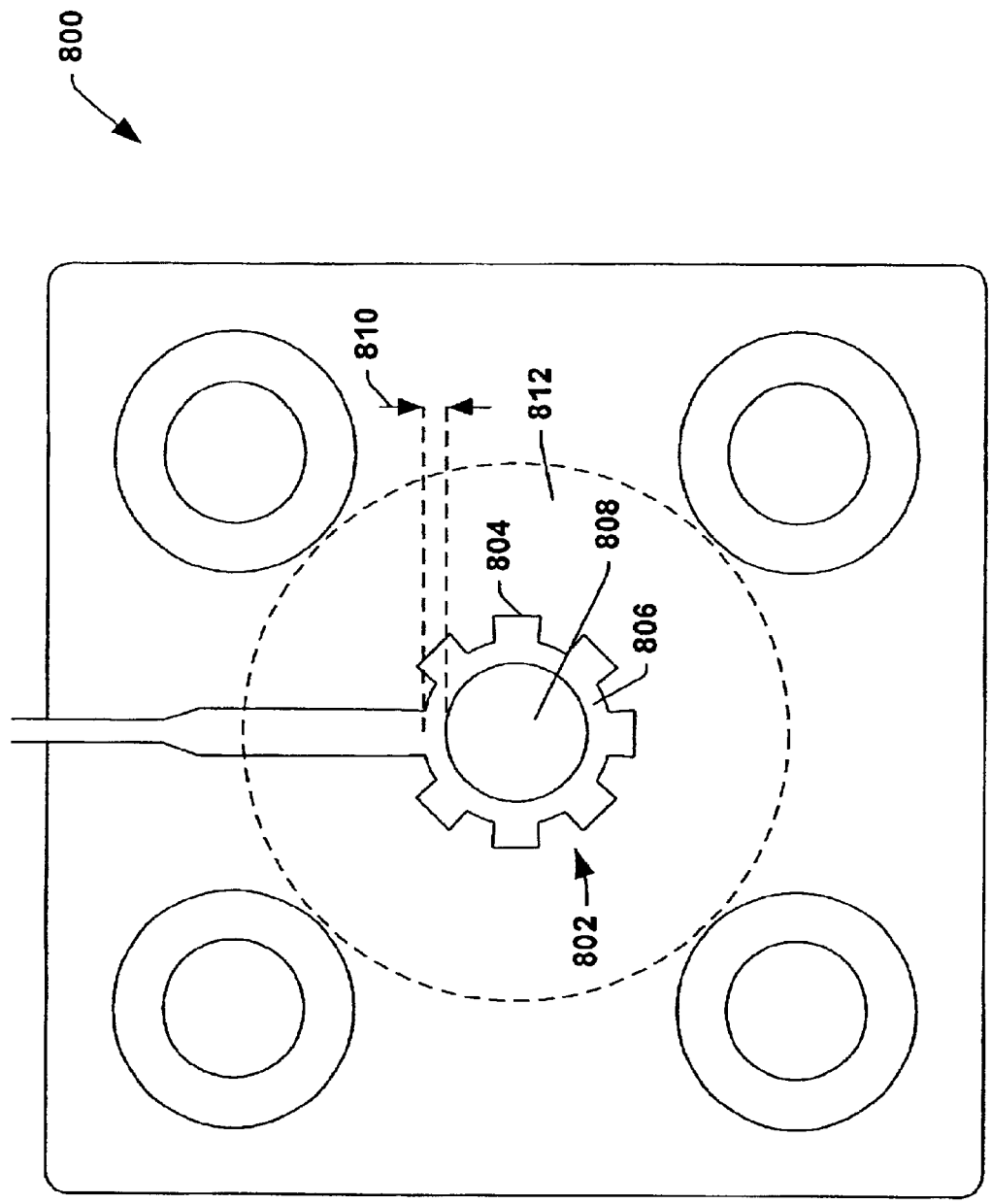
FIG. 8 illustrates a top view of a connector pad assembly according to an aspect of the present invention.

FIG. 8 illustrates yet another example of a subminiature connector assembly 800 that can be integrated into a circuit board to establish electrical connections and component mountings thereto according to one or more aspects of the present invention. In this example, the assembly 800 includes a central connector pad 802 having projections 804 extending radially from an inner disc portion 806 of the central pad. The projections 806 have a generally rectangular configuration.

Those skilled in the art will understand and appreciate that the radial projections 804 extending from the central connector pad 802 help stabilize the pad 802 and the associated central through-hole 808 relative to the circuit board. This enables a radial thickness 810 of the pad 802 to be reduced (e.g., from that of conventional pads) while maintaining structural integrity of the pad and through-hole 808. The reduced thickness of the inner disc portion 806 of the pad 802 decreases the surface area of overlapping conductive plates (e.g., the central pad and the ground or power layer), which provides a corresponding reduction in the capacitance between the pad and the associated conductive layer. The increased stability afforded by the projections 804 also allows the thickness of the anti-pad 812 (shown in phantom) to be increased. The increased thickness 810 of the anti-pad 812 further isolates the ground or power plane from the central pad 814 thereby further mitigating capacitive effects.

Figure 9:
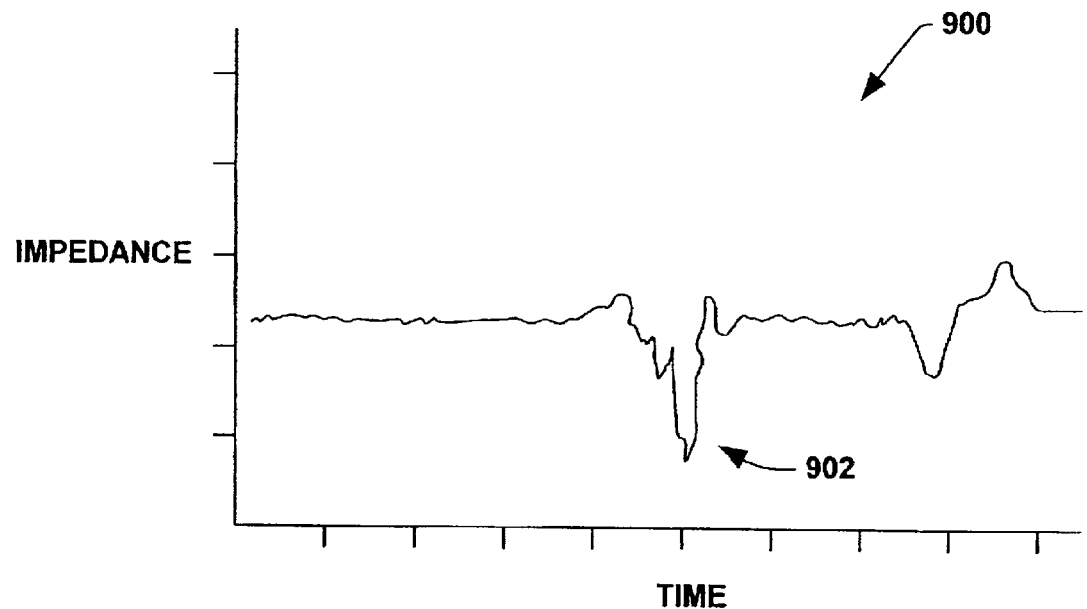
FIG. 9 illustrates a graph representing impedance associated with a trace coupled to a conventional connector pad assembly.
Figure 10:
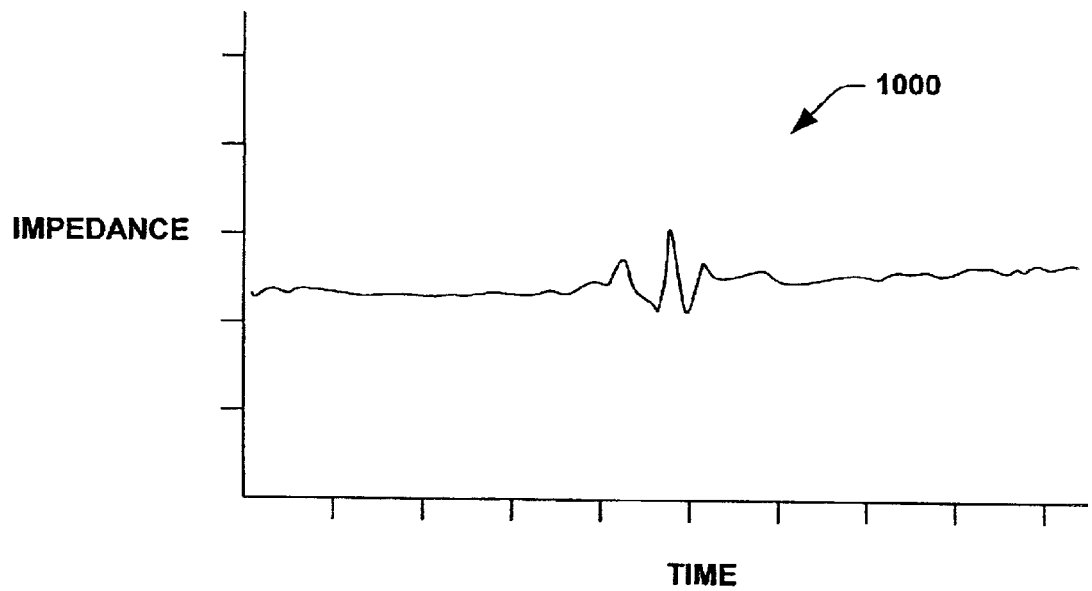
FIG. 10 illustrates a graph representing impedance associated with a trace coupled to a connector pad assembly according to an aspect of the present invention.

FIGS. 9 and 10 are graphs illustrating impedance (which is a function of capacitance) along respective traces of a circuit board that connect to connector pads of different subminiature connector assemblies. In particular, the graph 900 in FIG. 9 represents impedance (y-axis) relative to time (x-axis) as a signal moves along a trace connected to a conventional subminiature connector assembly. A spike 902 in the plotted signal near the middle of the graph corresponds to an increase in capacitance between the connector pad and an associated ground plane.

FIG. 10 illustrates a signal response 1000 for a trace on a circuit board that is coupled to a subminiature connector pad according to one or more aspects of the present invention. That is, the signal response depicted in FIG. 10 depicts the impedance along a trace coupled to a connector assembly having central connector pad with a reduced radial thickness and triangular projections, such as illustrated in FIG. 2. A comparison between the signal responses of FIGS. 9 and 10 demonstrates that change in the signal (e.g., capacitance) resulting from the interconnection between the trace and connector assembly according to an aspect of the present invention (FIG. 10) is less severe than that for the conventional assembly (FIG. 9). Thus, those skilled in the art will understand and appreciated that use of a subminiature connector assembly in accordance with an aspect of the present invention provides reduced capacitance and, in turn, enables improved circuit performance. It further will be appreciated that such benefits become more pronounced at signal frequencies above 1 GHZ, which are commonly used in conjunction with SMA, SMB, SMC as well as other types of connectors.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. For instance, it is to be appreciated that while four vias have been depicted as surrounding a central via, any number of through-holes may be included on a subminiature connector in accordance with one or more aspects of the present invention. Likewise, pads with projections may be utilized with other types of connectors, on both sides of a circuit board and/or on any connection layers to enhance stability and mitigate capacitance. The present invention can be utilized with layers that can be repeated and/or have various orders depending upon the configuration and layout of the board to achieve desired results.

What is claimed is:

1. A connector pad on a printed circuit board, comprising:
    an inner pad portion dimensioned and configured to circumscribe a through-hole of the circuit board;
    a plurality of projections extending outwardly from the inner pad portion to help stabilize the connector pad and the through-hole; and
    including a printed circuit board, such that the through-hole extends through at least a portion of the circuit board, the combination further comprising:
    a conductive layer that includes a non-conductive anti-pad circumscribing the through-hole to radially separate a conductive material thereof from the through-hole a distance defined by a radial thickness of the anti-pad,
    wherein the anti-pad having an inner radial edge that approximates the through-hole, an outer edge of the anti-pad being spaced radially from the through-hole by a distance that is at least equal to a distance between an outer radial end portion of the projections and the through-hole, such that there is substantially no overlap between the connector pad and the conductive material, thereby mitigating capacitance between the connector pad and the conductive material of the conductive layer.

2. The connector pad of claim 1, the inner pad portion comprising a generally annular disc portion, an inner radial edge of the disc portion approximating the through-hole.

3. The connector pad of claim 2, the inner disc portion having a radial thickness defined by the difference between an inner radius of the inner disc portion and an outer radius of the inner disc portion, the reduced radial thickness being facilitated by the projections.

4. The connector pad of claim 1, the outer edge of the anti-pad being spaced radially from the through-hole by a distance that is greater than the distance between the outer radial end portion of the projections and the through-hole, such that there is generally no overlap between the connector pad and the conductive material, thereby mitigating capacitance between the connector pad and the conductive material of the conductive layer.

5. The connector pad of claim 4, the radial thickness of the anti-pad reducing the proximity of the conductive material from the connector pad so as to mitigate capacitance build up between the connector pad and the conductive material of the conductive layer.

6. The connector pad of claim 1, the anti-pad comprising a dielectric material.

7. The connector pad of claim 1, the projections further comprising triangularly shaped projections extending outwardly from the annular pad portion in a generally circular array about the through-hole.

8. The connector pad of claim 1, the projections having a substantially trapezoidal configuration.

9. The connector pad of claim 1, at least two of the projections having at least one of different dimensions and configurations.

10. A connector pad on a printed circuit board, comprising:

an inner pad portion dimensioned and configured to circumscribe a through-hole of the circuit board; and a plurality of projections extending outwardly from the inner pad portion to help stabilize the connector pad and the through-hole;

the through-hole extends through at least a portion of the circuit board, the circuit board further comprising:

a conductive layer that includes a non-conductive anti-pad circumscribing the through-hole to radially separate a conductive material thereof from the through-hole a distance defined by a radial thickness of the anti-pad, wherein the anti-pad having an inner radial edge that approximates the through-hole, an outer edge of the anti-pad being spaced radially from the through-hole by a distance that is at least equal to a distance between an outer radial end portion of the projections and the through-hole, such that there is no overlap between the connector pad and the conductive material, thereby mitigating capacitance between the connector pad and the conductive material of the conductive layer, one second through-hole spaced from the first through-hole, a second connector pad being associated with the second through-hole and being generally coplanar with the first connector pad, the radial thickness of the inner pad portion of first connectors pad having radial thickness that is less than the second connector pad.

* * * * *